United States Patent [19]
Sakai

[11] Patent Number: 6,011,434
[45] Date of Patent: Jan. 4, 2000

[54] FEED-FORWARD AMPLIFIER

[75] Inventor: Kazuhiko Sakai, Tokyo, Japan

[73] Assignee: NEC Corporation, Japan

[21] Appl. No.: 09/053,166

[22] Filed: Apr. 1, 1998

[30] Foreign Application Priority Data

Apr. 2, 1997 [JP] Japan ................................. 9-083179

[51] Int. Cl.[7] ................................................ H03F 1/00
[52] U.S. Cl. .................................... 330/151; 330/149
[58] Field of Search ............................ 330/151, 149, 330/52

[56] References Cited

U.S. PATENT DOCUMENTS

| | | | |
|---|---|---|---|
| 5,455,537 | 10/1995 | Larkin et al. | 330/52 |
| 5,493,252 | 2/1996 | Takai | 330/52 |
| 5,515,000 | 5/1996 | Maruyama et al. | 330/52 |
| 5,610,554 | 3/1997 | Anvari | 330/52 |
| 5,775,018 | 6/1998 | Gianfortune et al. | 330/52 |
| 5,847,603 | 12/1998 | Myer | 330/52 |

FOREIGN PATENT DOCUMENTS

| | | |
|---|---|---|
| 1-200807 | 8/1989 | Japan . |
| 7-15397 | 1/1995 | Japan . |
| 7-273562 | 10/1995 | Japan . |
| 8-78965 | 3/1996 | Japan . |

*Primary Examiner*—Benny Lee
*Assistant Examiner*—Henry Choe
*Attorney, Agent, or Firm*—Ostrolenk, Faber, Gerb & Soffen, LLP

[57] ABSTRACT

The present invention provides a feed-forward amplifier having a predistortion circuit to provide a sufficient compensation for a variation in temperature. When a predistortion circuit 3 is used to minimize distortion in a main amplifier 6, the circuit 3, a variable attenuator 4, a variable phase shifter 5, and a main amplifier 6 are located in this order and a control circuit 19 controls the variable attenuator 4 and variable phase shifter 5 so that a carrier component, that is, an input signal, in a detected distortion component decreases to a minimum. In this manner, when the gain of the main amplifier 6 varies due to a variation in temperature, the preceding variable attenuator 4 and variable phase shifter 5 compensate for the variation of the gain. The input level of the predistortion circuit 3, however, is not affected, so the relationship between the output levels of the predistortion circuit 3 and main amplifier 6 remain unchanged compared to the amount prior to the temperature variation, thereby providing the same compensation effect.

8 Claims, 5 Drawing Sheets

FEED-FORWARD AMPLIFIER

BACKGROUND OF THE INVENTION

1. Field of the Invention

The present invention relates to a feed-forward amplifier, and in particular, to a feed-forward amplifier including an error detection loop that has a predistortion compensator in an input path to a main amplifier to detect a distortion component in the main amplifier; and an error rejection loop that injects into the output of the main amplifier the distortion component detected by the error detection loop so as to remove the distortion.

2. Description of the Prior Art

An example of such a feed-forward amplifier is disclosed in Japanese Patent Application Laid-Open No. Hei 1-200807, and FIG. 4 shows a block diagram of this amplifier. Referencing FIG. 4, this amplifier has an error detection loop 100 that detects a distortion component in a main amplifier 106 and an error rejection loop 200 that injects the detected distortion component into an output signal path 114 from the main amplifier 106 to remove the distortion.

The error detection loop 100 has a predistortion circuit (a predistortion compensator) 120A at the input of the main amplifier 106 to minimize the distortion in the main amplifier 106 and also has on a delay line 109 an attenuator 108 for controlling the error detection loop 100.

A signal input from an input terminal 101 is divided by a power divider 103, and one of the outputs from the power divider is input to a power combiner 104 through the predistortion circuit 120A and main amplifier 106. In addition, the other output from the power divider 103 is input through a variable attenuator 108 and a variable delay line 109 to the power combiner 104, in which it is combined with an output from the main amplifier 106.

The same component as in the main amplifier 106 is supplied from the power combiner 104 to the output signal path 114 from the main amplifier, and the distortion component in the main amplifier 106 detected by the error detection loop 100 is output to an error injection path 115. A signal on the error injection path 115 passes through a variable attenuator 110 and a variable delay line 111, and is amplified by an auxiliary amplifier 107 and then combined with the signal in the output signal path 114 from the main amplifier by the power combiner 105. The output from the power combiner 105 is output from an output terminal 102.

In addition, FIG. 5 shows another conventional example wherein like components have the same reference numerals as in FIG. 4. In this example, the error injection path 115 is input to the auxiliary amplifier 107 through the variable attenuator 110, the variable delay line 111, and a predistortion circuit 120B. The predistortion circuit 120B reduces the distortion in the auxiliary amplifier 107. The remainder of this configuration is the same as in FIG. 4.

These conventional examples have the following problems. First, if the gain of the main amplifier 106 varies due to a variation in the ambient temperature, a corresponding variation in output level causes the amount of distortion occurring in the main amplifier 106 to vary but this distortion cannot be compensated for due to the constant distortion compensation amount of the predistortion circuit 120A.

In general, in the feed-forward amplifier, if the gain of the main amplifier 106 varies due to a variation in the ambient temperature, the variable attenuator 108 interposed into a linear signal path 113 must be adjusted so that the signal path 112 from the main amplifier and the linear signal path 113 have the same gain and opposite phases, in order to extract distortion correctly. The feed-forward amplifiers in FIGS. 4 and 5, however, have the variable attenuator 108 in the linear signal path 113, so the output level of the main amplifier 106 remains changed.

Second, if the gain of the auxiliary amplifier 107 varies due to a variation in the ambient temperature, the compensation amount of the predistortion circuit 120B varies to prevent the distortion in the auxiliary amplifier 107 from being compensated for.

In general, in the feed-forward amplifier, if the gain of the auxiliary amplifier 107 varies due to a variation in the ambient temperature, the variable attenuator 110 is controlled so that the output signal path 114 from the main amplifier and the error injection path 115 have the same gain and opposite phases, in order to extract distortion correctly. In the conventional feed-forward amplifier with the variable attenuator 110 preceding the predistortion circuit 120B, however, the above operation causes the input level of the predistortion circuit 120B and thus the compensation amount to vary.

SUMMARY OF THE INVENTION

It is an object of this invention to provide a feed-forward amplifier that allows the predistortion circuit to provide compensation effects even if the gain of the main or auxiliary amplifier varies due to a variation in ambient temperature.

This invention provides a feed-forward amplifier comprising a main amplifier; a predistortion compensator provided in an input path to the main amplifier; error detection means for detecting a distortion component in the main amplifier; and an error rejection means for injecting the detected distortion component into the output of the main amplifier so as to remove the distortion, characterized in that the circuit includes a variable attenuator and a variable phase shifter provided between the predistortion compensator and the main amplifier; and control means for controlling the variable attenuator and variable phase shifter so that an input signal component contained in the distortion detected by the error detection means decreases to a minimum.

The operation of this invention is described. If the gain of the main or auxiliary amplifier varies due to a variation in temperature, the variable attenuator and variable phase shifter interposed into the input path to the amplifier can be optimally controlled by controlling only the variation of the gain of the amplifier while providing no control to the input of the predistortion compensator (the predistortion circuit) preceding the amplifier in order to provide the same compensation to the predistortion compensator as provided prior to the temperature variation, thereby enabling error rejection without being affected by the temperature variation.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Next, embodiments of this invention are described in detail with reference to the drawings.

Figure 1:
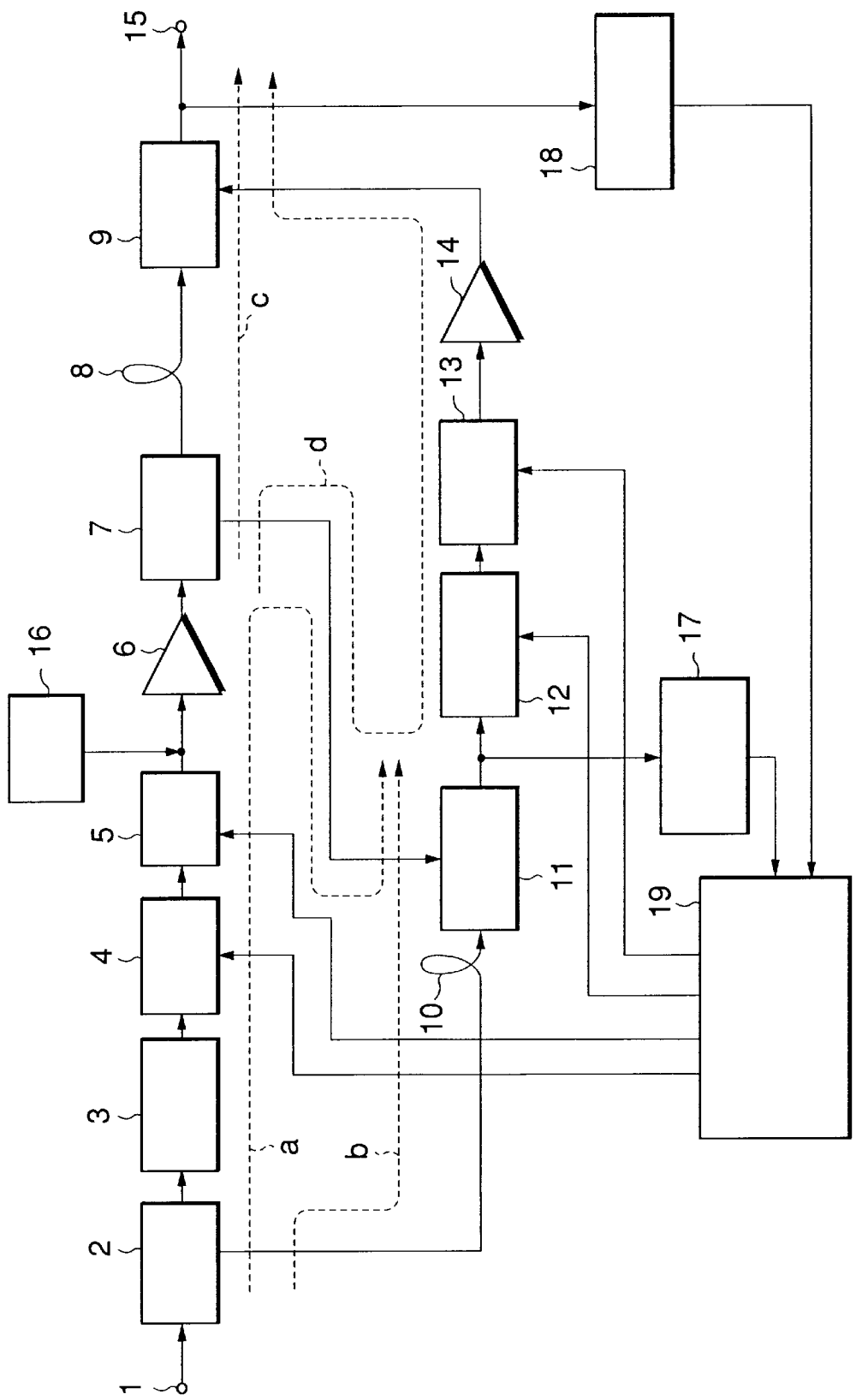
FIG. 1 is a block diagram of one embodiment of this invention.

Referencing FIG. 1, a signal input from an input terminal 1 is divided into signal paths (a) and (b) by a divider 2. The signal output as the signal path (a) passes through a predistortion circuit 3, a variable attenuator 4, and a variable phase shifter 5, whereupon a pilot signal generated from a pilot signal generator 16 is then injected into the signal, which is subsequently input to a main amplifier 6. The variable attenuator 4 and variable phase shifter 5 are controlled by a control circuit 19.

The output from the main amplifier 6 is input to a divider 7, wherein one of the outputs from the divider 7 is input to a combiner 9 through a delay line 8, while the other is input to a combiner 11. The combiner 11 combines a signal that has passed through a delay line 10 with the output from the divider 7. The output from the combiner 11 is input to an auxiliary amplifier 14 through a variable attenuator 12 and a variable phase shifter 13. The variable attenuator 12 and variable phase shifter 13 are controlled by the control circuit 19.

The output from the auxiliary amplifier 14 is combined with a signal delivered to the combiner 9 through the delay line 8 and is then output from an output terminal 15. At the output point of the combiner 11, a carrier detector 17 detects a carrier component (a single-frequency component of a signal for amplification that is supplied to the input terminal 1), and inputs the detected carrier level to the control circuit 19.

In addition, at the output point of the combiner 9, a pilot signal detector 18 detects the level of the injected pilot signal and inputs it to the control circuit 19.

Next, the operation of the circuit in FIG. 1 is described. A signal input from the input terminal 1 is divided into the signal paths (a) and (b) by the divider 2. The signals in the signal paths (a) and (b) are combined by the combiner 11, and a carrier component in the combined output is detected by the carrier detector 17 and input to the control circuit 19.

The control circuit 19 controls the variable attenuator 4 and variable phase shifter 5 so that the output from the carrier detector 17 decreases to a minimum. This control allows the signal paths (a) and (b) to have the same amplitude and opposite phases in order to enable only the distortion component in the main amplifier 6 to be extracted at the output of the combiner 11.

The signal path (a) uses the predistortion circuit 3 to minimize the distortion in the main amplifier 6. The distortion component detected by the combiner 11 flows through the variable attenuator 12 and variable phase shifter 13, and is then amplified by the auxiliary amplifier 14 and then combined by the combiner 9 with a signal that has passed through the delay line 8. A pilot signal component contained in the output from the combiner 9 is detected by the pilot detector 18 and input to the control circuit 19.

The control circuit 19 controls the variable attenuator 12 and variable phase shifter 13 so that the output from the pilot detector 18 decreases to a minimum. This control allows the signal paths (c) and (d) to have the same amplitude and opposite phases in order to cancel distortion occurring in the main amplifier 6.

Figure 2A:
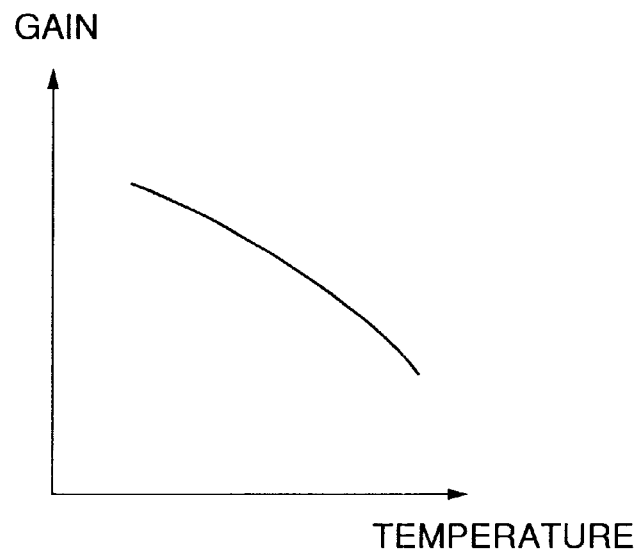
FIGS. 2(a) and 2(b) show the characteristics of an amplifier shown in FIG. 1.
Figure 2B:
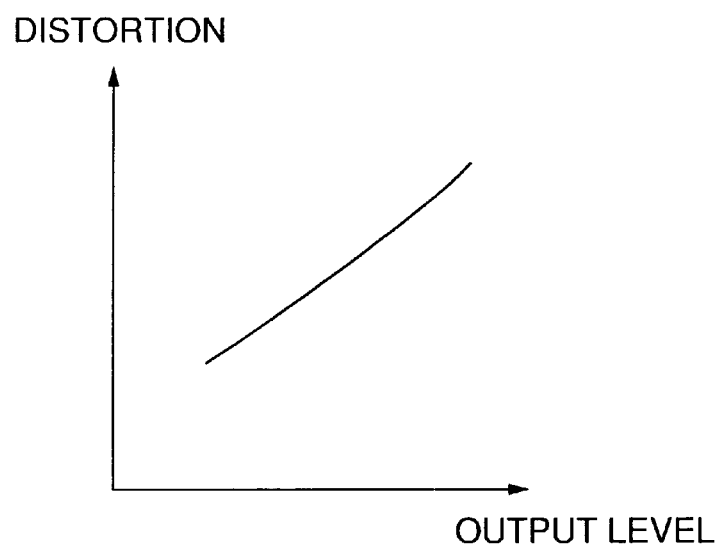

Next, the operation performed if the ambient temperature varies is explained in conjunction with the embodiment shown in FIG. 1. It is generally known that the power amplifier used for the main amplifier 6 experiences a gain decrease if the ambient temperature increases as shown in FIG. 2(a). It is also generally known that the distortion component depends more significantly on the output power than on the ambient temperature and that it increases with increasing output level as shown in FIG. 2(b).

In FIG. 1, the ambient temperature is assumed to increase. When the ambient temperature increases, the gain of the main amplifier 6 decreases as shown in FIG. 2(a), but under this condition, the signal paths (a) and (b) have different amplitudes, thereby causing the combiner 11 to output a signal before completely canceling a carrier component. The carrier component output from the combiner 11 is detected by the carrier detector 17 and then input to the control circuit 19.

Since the control circuit 19 controls the variable attenuator 4 and variable phase shifter 5 so that the output from the carrier detector 17 decreases to a minimum, after the attenuation by the variable attenuator 4 has been reduced by an amount corresponding to the decrease in the gain of the main amplifier 6, the output from the carrier detector 17 decreases to a minimum again. This operation maintains the output level of the main amplifier 6 at a constant value while maintaining the amount of distortion unchanged compared to the amount prior to the temperature variation.

In addition, since the predistortion circuit 3 precedes the variable attenuator 4, it operates at a constant level regardless of the above operations. Thus, the operational level of the predistortion circuit 3 and the amount of distortion in the main amplifier 6 are the same as those existing prior to the temperature variation, so compensation is constantly provided so as to minimize the distortion in the main amplifier 6.

Next, a second embodiment is described with reference to FIG. 3. In this figure, like components have the same reference numerals as in FIG. 1. Referencing FIG. 3, a predistortion circuit 20 is provided between the combiner 11 and the variable attenuator 12.

The operation performed if the ambient temperature varies is explained as in the first embodiment. In general, the power amplifier used for the auxiliary amplifier 14 also experiences a gain decrease if the ambient temperature increases as shown in FIG. 2(a). In addition, the distortion component depends more significantly on the output power than on the ambient temperature and increases with increasing output level as shown in FIG. 2(b).

Figure 3:
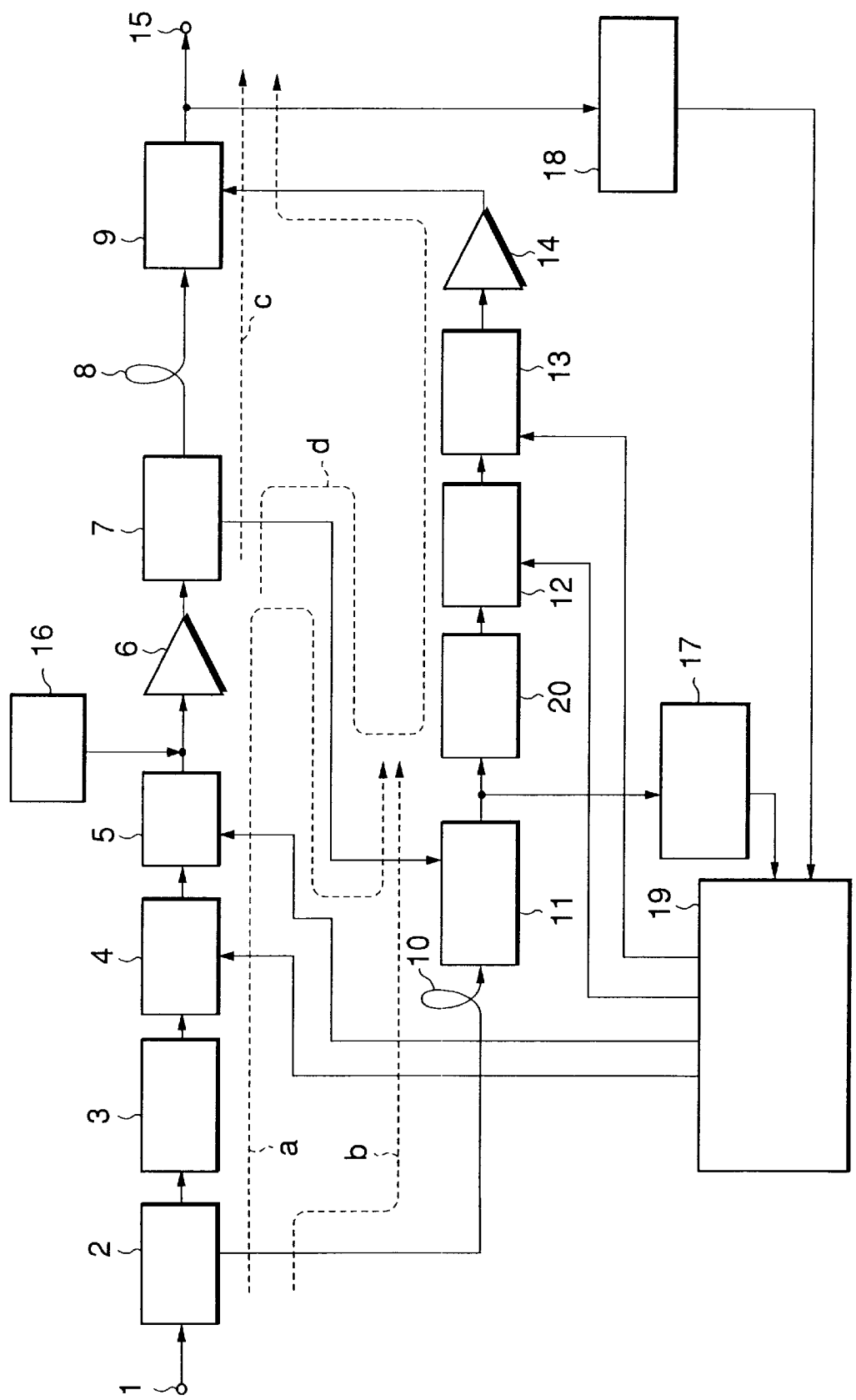
FIG. 3 is a block diagram of another embodiment of this invention.
Figure 4:
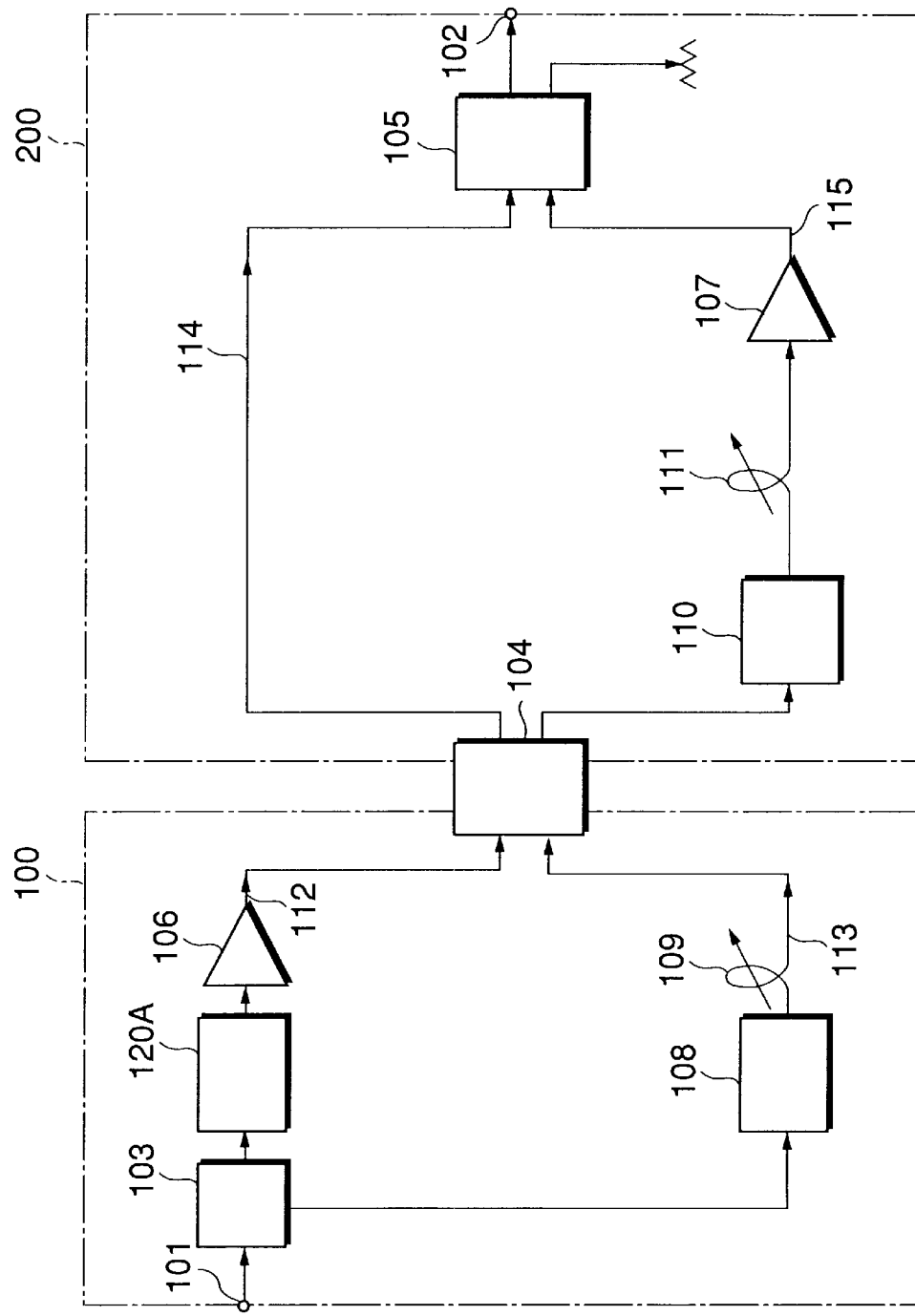
FIG. 4 shows an example of a conventional feed-forward amplifier.
Figure 5:
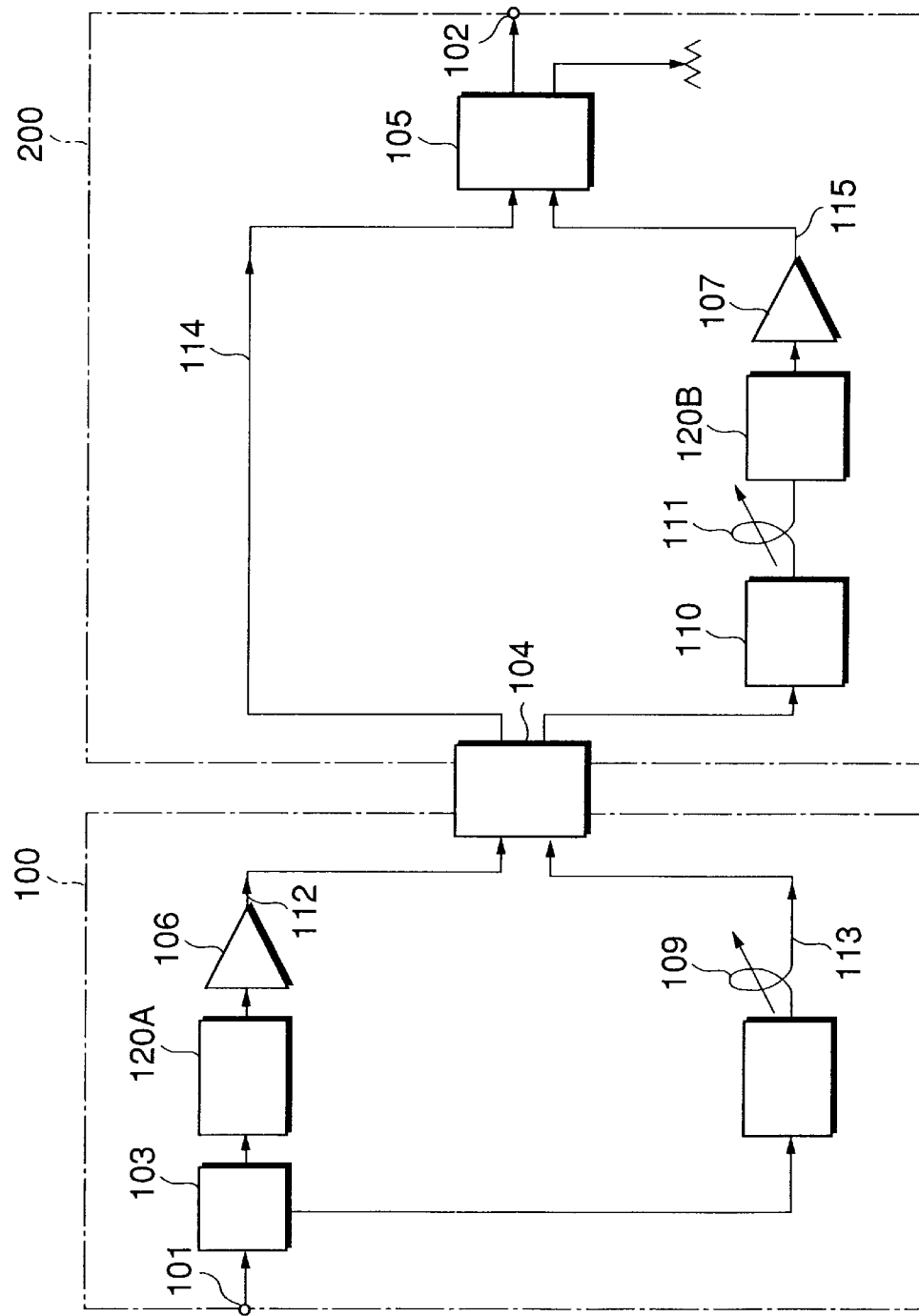
FIG. 5 shows another example of a conventional feedforward amplifier.

In FIG. 3, the ambient temperature is assumed to increase. When the ambient temperature increases, the gain of the auxiliary amplifier 14 decreases as shown in FIG. 2(a), but under this condition, the signal paths (c) and (d) have different amplitudes, thereby causing the combiner 9 to output a signal before completely canceling an injected pilot signal.

The pilot signal output from the combiner 9 is detected by the pilot signal detector 18 and then input to the control circuit 19. Since the control circuit 19 controls the variable attenuator 12 and variable phase shifter 13 so that the output from the pilot signal detector 18 decreases to a minimum, after the attenuation by the variable attenuator 12 has been reduced by an amount corresponding to the decrease in the gain of the auxiliary amplifier 14, the output from the pilot signal detector 18 decreases to a minimum again.

This operation maintains the output level of the auxiliary amplifier 14 at a constant value while maintaining the amount of distortion output from the auxiliary amplifier 14 unchanged compared to the amount prior to the temperature variation. In addition, since the predistortion circuit 20 precedes the variable attenuator 12, it operates at a constant level regardless of the above operations. Thus, the operational level of the predistortion circuit 20 and the amount of distortion in the auxiliary amplifier 14 are the same as those existing prior to the temperature variation, so compensation is constantly provided so as to minimize the distortion in the auxiliary amplifier 14.

A feature of this invention in addition to the abovementioned summary is that the input signal has a carrier of a single frequency and in that the control means provides control such that the level of the carrier decreases to a minimum.

Another fraction of this invention is that the error rejection means has an auxiliary amplifier that amplifies the detected distortion, and a second variable attenuator and a second variable phase shifter provided in the input path to the auxiliary amplifier in order to combine an output from the auxiliary amplifier with an output from the main amplifier, and also the control means controls the second variable attenuator and variable phase shifter so that the detected distortion decreases to a minimum.

Furthermore, a feature of this invention is that the control means cooperates with a pilot signal generator that supplies a pilot signal to the input of the main amplifier, and controls the second variable attenuator and variable phase shifter so that the level of a pilot signal contained in an output from the error rejection means decreases to a minimum, and also that a second predistortion compensator is provided in the input path to the error rejection means.

A first effect of this invention is that the distortion is compensated for using the predistortion circuit even if the gain of the main amplifier varies due to a variation in ambient temperature.

This is because the main-amplifier side of the error detection loop is composed of a predistortion circuit, variable attenuator, variable phase shifter, and main amplifier disposed in this order, wherein the variable attenuator and variable phase shifter are automatically controlled so that if the gain of the main amplifier varies due to a variation in ambient temperature, the variable attenuator is automatically controlled so as to absorb the variation of the gain of the main amplifier whereas the input level of the predistortion circuit is not affected by this automatic control, thereby providing the same amount of compensation as provided prior to the variation of the gain.

A second effect of this invention is that the distortion is compensated for using the predistortion circuit even if the gain of the auxiliary amplifier varies due to a variation in ambient temperature.

This is because the auxiliary-amplifier side of the error rejection loop is composed of a predistortion circuit, variable attenuator, variable phase shifter, and auxiliary amplifier disposed in this order, wherein the variable attenuator and variable phase shifter are automatically controlled so that if the gain of the auxiliary amplifier varies due to a variation in ambient temperature, the variable attenuator is automatically controlled so as to absorb the variation of the gain of the auxiliary amplifier whereas the input level of the predistortion circuit is not affected by this automatic control, thereby providing the same amount of compensation as provided prior to the variation of the gain.

What is claimed is:

1. A feed-forward amplifier comprising:

an error detection loop for detecting a distortion component, including a main amplifier, a predistortion compensator for reducing distortion in said main amplifier, said predistortion compensation being provided in the error detection loop in an input path to said main amplifier, a variable attenuator provided between said predistortion compensator and said main amplifier, and a variable phase shifter provided between said predistortion compensator and said main amplifier;

an error rejection loop for injecting the detected distortion component into the output of said main amplifier to remove the distortion; and control means for controlling said variable attenuator and variable phase shifter so that an input signal component contained in the distortion detected by said error detection loop decreases to a minimum.

2. A feed-forward amplifier according to claim 1, wherein said input signal has a carrier of a single frequency and wherein said control means provides control such that the level of the carrier decreases to a minimum.

3. A feed-forward amplifier according to claim 1, wherein said error rejection loop includes an auxiliary amplifier that amplifies said detected distortion;

a second variable attenuator provided in the input path to the auxiliary amplifier; and a second variable phase shifter provided in the input path to the auxiliary amplifier, said second variable attenuator and said second variable phase shifter being provided in order to combine an output from said auxiliary amplifier with an output from said main amplifier, and wherein said control means controls said second variable attenuator and variable phase shifter so that said detected distortion decreases to a minimum.

4. A feed-forward amplifier according to claim 3, wherein said control means cooperates with a pilot signal generator that supplies a pilot signal to the input of said main amplifier, in controlling said second variable attenuator second variable phase shifter so that the level of a pilot signal contained in an output from said error rejection loop decreases to a minimum.

5. A feed-forward amplifier according to claim 3, wherein said error rejection loop further includes a second predistortion compensator provided in said input path to said auxiliary amplifier.

6. A feed-forward amplifier according to claim 2, wherein said error rejection loop includes an auxiliary amplifier that amplifies said detected distortion;

a second variable attenuator provided in the input path to the auxiliary amplifier; and a second variable phase shifter provided in the input path to the auxiliary amplifier, said second variable attenuator and said second variable phase shifter being provided in order to combine an output from said auxiliary amplifier with an output from said main amplifier, and wherein said control means controls said second variable attenuator and second variable phase shifter so that said detected distortion decreases to a minimum.

7. A feed-forward amplifier according to claim 6, wherein said control means cooperates with a pilot signal generator that supplies a pilot signal to the input of said main amplifier, in controlling said second variable attenuator and second variable phase shifter so that the level of a pilot signal contained in an output from said error rejection loop decreases to a minimum.

8. A feed-forward amplifier according to claim 6, wherein said error rejection loop further includes a second predistortion compensator provided in said input path to said auxiliary amplifier.

* * * * *